United States Patent [19]

Scherer et al.

[11] 4,416,067

[45] Nov. 22, 1983

[54] CORRECTION METHOD AND DEVICE FOR A MAGNETIC FIELD PROBE

[75] Inventors: Hartmut Scherer; Peer Thilo, both of Munich, Fed. Rep. of Germany

[73] Assignee: Siemens Aktiengesellschaft, Berlin & Munich, Fed. Rep. of Germany

[21] Appl. No.: 378,020

[22] Filed: May 13, 1982

[30] Foreign Application Priority Data

Jun. 11, 1981 [DE] Fed. Rep. of Germany ....... 3123180

[51] Int. Cl.³ ............................................. G01C 17/38
[52] U.S. Cl. ........................................ 33/356; 33/357
[58] Field of Search ................... 33/356, 355 R, 357, 33/361, 362, 363 Q, 301, 363 A

[56] References Cited

U.S. PATENT DOCUMENTS

| 3,683,668 | 8/1972 | Baker et al. | 73/1 |
|---|---|---|---|
| 3,959,889 | 6/1976 | Thomas | 33/355 R |
| 3,991,361 | 11/1976 | Mattern et al. | 33/356 |
| 4,031,630 | 6/1977 | Fowler | 33/356 |
| 4,091,543 | 5/1978 | Lapeyre | 33/356 |
| 4,124,897 | 11/1978 | Martin | 33/356 |
| 4,327,498 | 5/1982 | Setter et al. | 33/356 |

FOREIGN PATENT DOCUMENTS 2949815 6/1981 Fed. Rep. of Germany .
1540068 2/1979 United Kingdom ......... G01C 17/38

*Primary Examiner*—Willis Little
*Attorney, Agent, or Firm*—Hill, Van Santen, Steadman & Simpson

[57] ABSTRACT

In a correction system for a magnetic field probe, the probe is first moved in a circle for calibration such that respective maximum and minimum values of a measured magnetic field vector or a respective component thereof is determined. By means of a sum formation and halving of the respective maximum and minimum value, a respective additive correction value is derived which is added to the respective measured values during navigation with the magnetic field probe. By so doing, a noise vector superimposed on the external magnetic field is eliminated.

8 Claims, 7 Drawing Figures

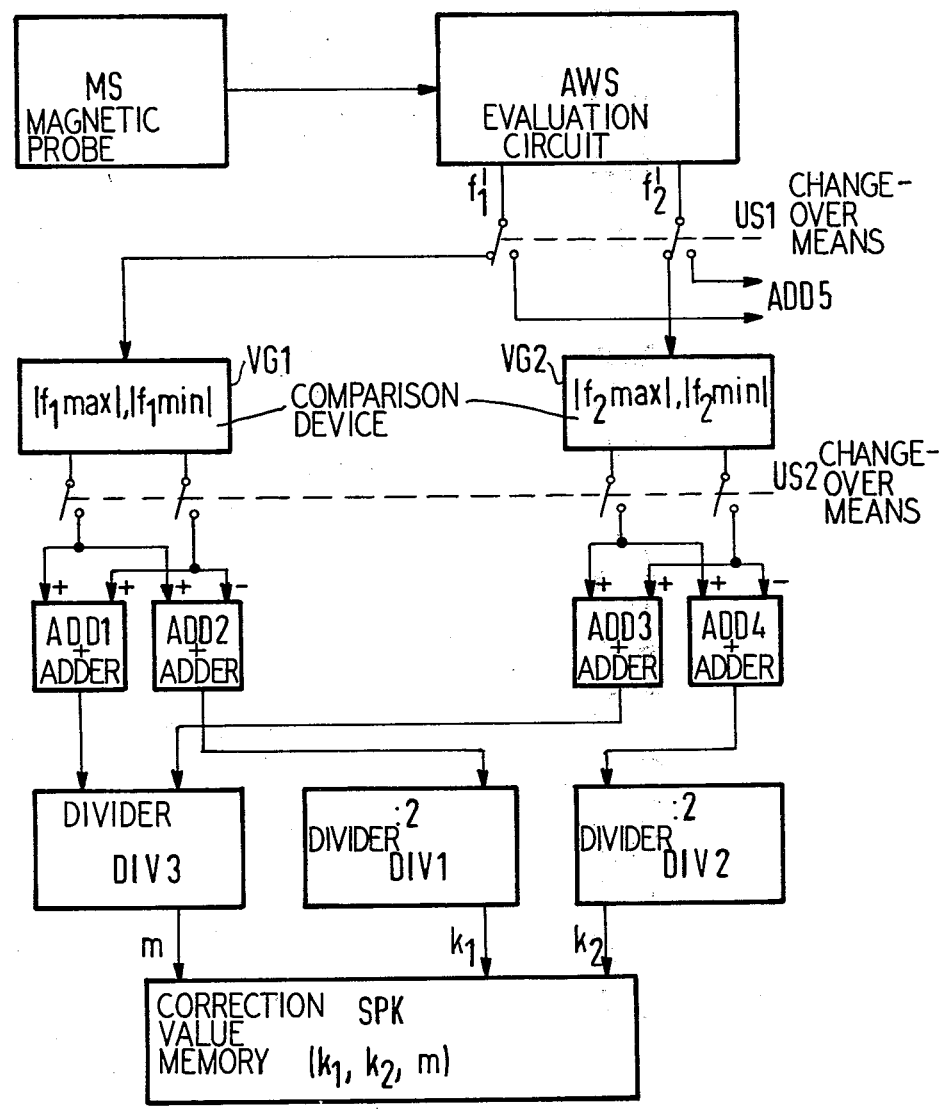

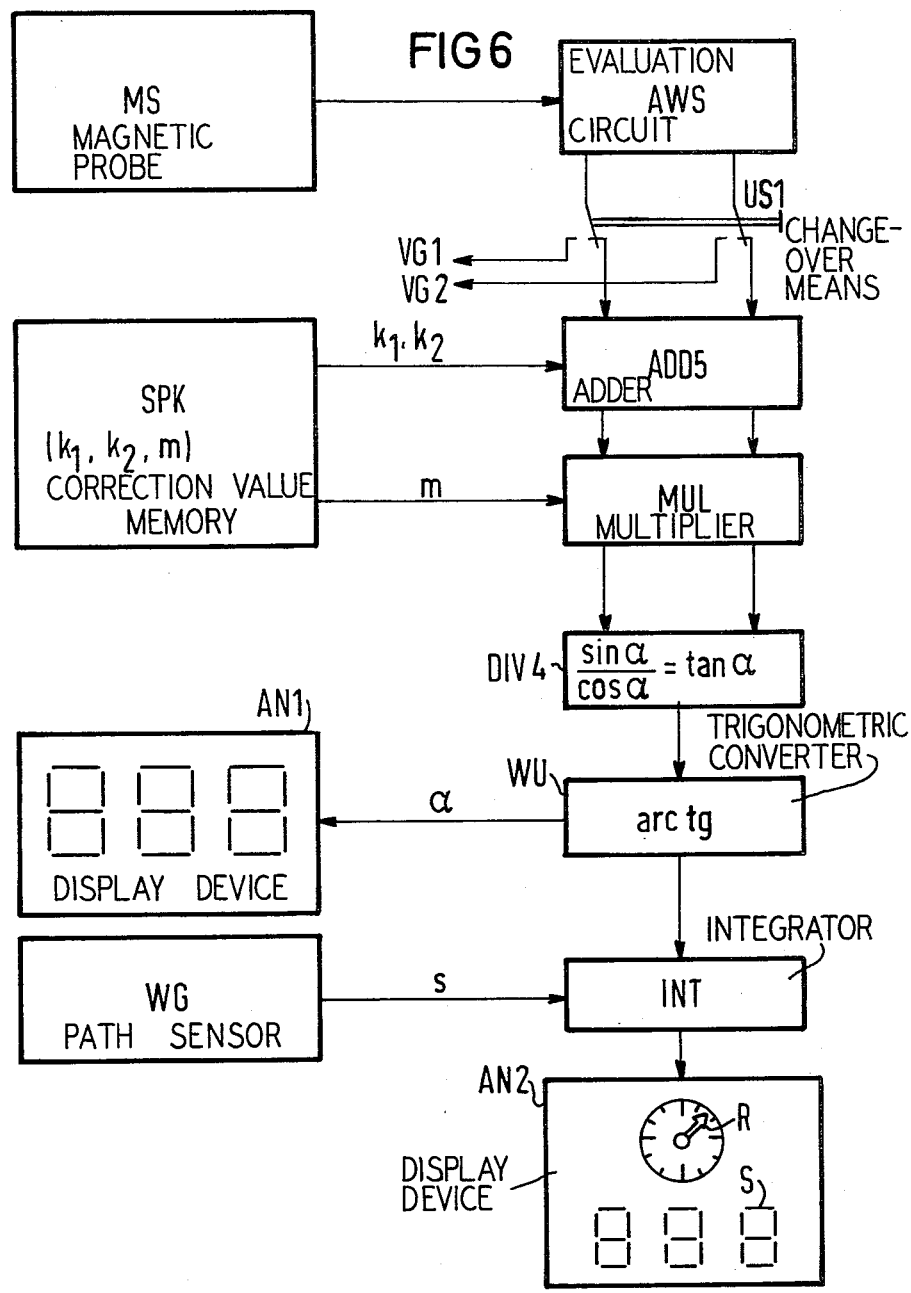

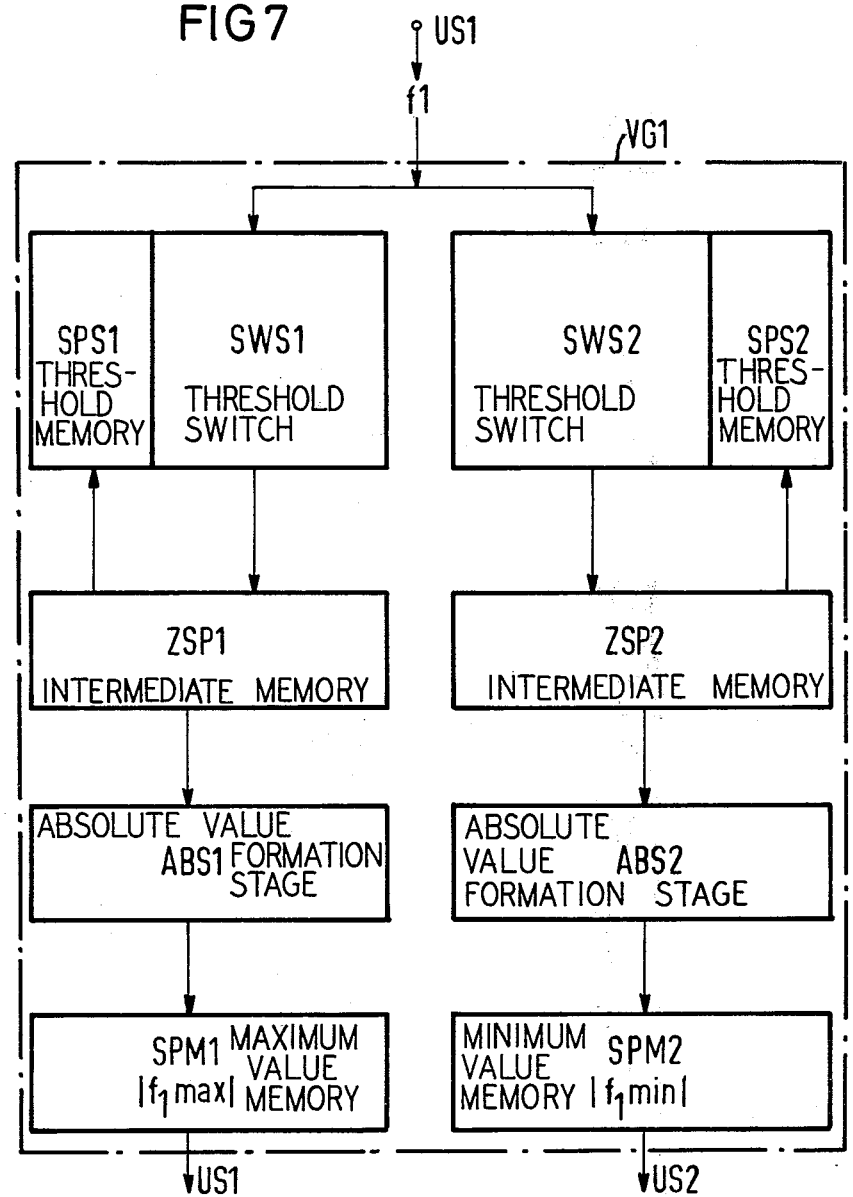

CORRECTION METHOD AND DEVICE FOR A MAGNETIC FIELD PROBE

BACKGROUND OF THE INVENTION

The invention relates to a correction method for a magnetic field probe by which an external magnetic field, particularly the earth's magnetic field, is respectively measured in terms of strength and direction. Moreover, the invention relates to a device for the implementation of this method.

Magnetic field probes such as electronic compasses are already known in various forms. For example, such probes are constructed with two coils which are perpendicular relative to one another and whose induction is influenced by the earth's magnetic field or by some other external magnetic field. Measuring methods which exploit this effect are disclosed, for example, in the German patent application Nos. P 29 49 815; P 30 29 532; and P 31 21 234; all incorporated herein by reference.

In the employment of compasses, particularly in vehicles such as in ships, aircraft, and even land vehicles, various errors occur which become apparent as a result of a magnetic declination. This magnetic declination arises, on the one hand, as a result of undesired magnetic fields in the vehicle or in the probe itself and, on the other hand, as a result of the probe not having been operatively positioned in an exactly horizontal fashion. A further error can result from the type of probe. If, for example, the two components of the magnetic field are measured in the probe with two different coils, then errors can result from inequalities of the two coils or in the evaluation electronics.

In order to avoid magnetic declinations in compasses, it is already known to slowly rotate the vehicle with the built-in compass by 360° on a compensation platform. Accordingly a data table is produced point-by-point from which the allocation between the indicated and true angle relative to magnetic North results. Another possibility of correction consists in reducing the magnetic declination with the assistance of individually attached compensation magnets. The execution of these techniques is involved. In particular, they are difficult to automate or they lead to high apparatus expense.

SUMMARY OF THE INVENTION

An object of the invention is the correction of a magnetic field probe with simple means and without involved devices such as a compensation platform. The correction should be very precise and lead directly to the output of the correct measured result so that conversion tables and the like are superfluous.

This object is achieved by moving the probe in a circle before the beginning of the measurement, and the maximum and minimum values of the magnetic field vector relative to the probe are determined by means of continuous measurement of this magnetic field vector. A correction vector is formed from the halved vector sum of these values and is later vectorially added to the respective measured values of the probe during the continuous measurement.

The invention is based on the perception that all disruptive influences due to undesired external magnetic fields can be added up to a noise vector and that the vector can be compensated by means of the addition of an oppositely directed vector of the same magnitude. Since there is a very specific direction given which the field vector of the magnetic field to be measured coincides in the direction with the noise vector, a maximum value is measured in this direction, whereas, given a rotation of 180° opposite this maximum value, the noise vector is subtracted from the field vector and thus a minimum measured value is produced. Thus, the noise vector can be determined by means of inventive measurement of a maximum and a minimum value and by means of halving the vector sum. A correspondingly opposing correction vector can be stored which is then automatically added to each measured result in the magnetic field measurement.

The execution of the correction method depends on the type of measuring method employed or, respectively, on the type of probe. When the measurement is carried out in the polar coordinate system, then the correction vector can be obtained by means of vectorial addition of the magnitude-wise maximum and minimum values of the magnetic field vector as well as by means of magnitude halving and inversion of the vector sum. Thus, in this case the angle of the correction vector is shifted by 180° relative to the maximum value of the field vector determined in the calibration.

When the measurement is undertaken in a Cartesian coordinate system, then the maximum and the minimum value are separately measured for two components of the magnetic field vector which are perpendicular relative to one another, and subsequently the amount of the minimum value is subtracted from the amount of the maximum value for each component. From this a separate correction value for the two respective components can be determined by means of halving. This correction value is then respectively separately added to the measured value of the respective vector component.

As initially mentioned, there is danger in the measurement of separate magnetic field components that inequalities of the employed coils or of the evaluation electronics could likewise lead to a magnetic declination of the compass. For the compensation of this error, it is provided in a further development of the invention that the sum of the absolute maximum and the absolute minimum value is respectively formed for the two components of the magnetic field vector and that the quotient from the sum value of the first and the second measured component is employed as a correction factor for the measured values of the second component.

When the magnetic field probe is built into a vehicle, for the purpose of calibration the vehicle is expediently driven in a circle once, whereby the additive correction values and, if need be, the correction factor are determined and stored. This calibration trip can be carried out at any desired location, for example in a parking lot. Special turning platforms, compensation platforms, or other such devices are not required.

A device is expediently provided for the execution of the inventive method in which the output of an evaluation circuit following the magnetic field probe can be selectively connected through a changeover means to a calibration arrangement and to a measuring installation with a following display means. Consequently, a correction value memory is provided which is connected with its input to the calibration arrangement and is connected with its output to the measuring installation. The calibration arrangement can exhibit comparison devices for determining the maximum and minimum values, adders following the comparison devices, and dividers following the adders whose outputs are supplied to the correction value memory. Each comparison device preferably exhibits threshold switches back-coupled over intermediate memories both for positive as well as for negative values. The threshold switches are respectively followed by an absolute value formation stage as well as respective memories for the maximum or the minimum values. An adder is expediently provided in the measuring installation, and additive correction values supplied from the correction value memory are added to the respective measured values therein. Also, a multiplier can be provided in the measuring installation, and the measured values of at least one magnetic field component are multiplied by a correction factor supplied from the correction value memory therein. A divider, a trigonometric converter, and a display means can follow the adder or the multiplier in a manner known per se. For a navigation device in a vehicle, the output of the trigonometric converter is expediently supplied in common with the output of a path sensor to a display means over an integrator. Thus, both the direction as well as the path to the traversed from a starting point to a destination can be displayed in the vehicle over a suitable display device.

BRIEF DESCRIPTION OF THE DRAWINGS

FIG. 5 illustrates a fundamental circuit for the derivation of correction values;

FIG. 6 illustrates a fundamental circuit of the measuring installation for deriving corrected measured values; and FIG. 7 illustrates a more detailed fundamental circuit of a comparison device from FIG. 5.

DESCRIPTION OF THE PREFERRED EMBODIMENTS

Figure 1:
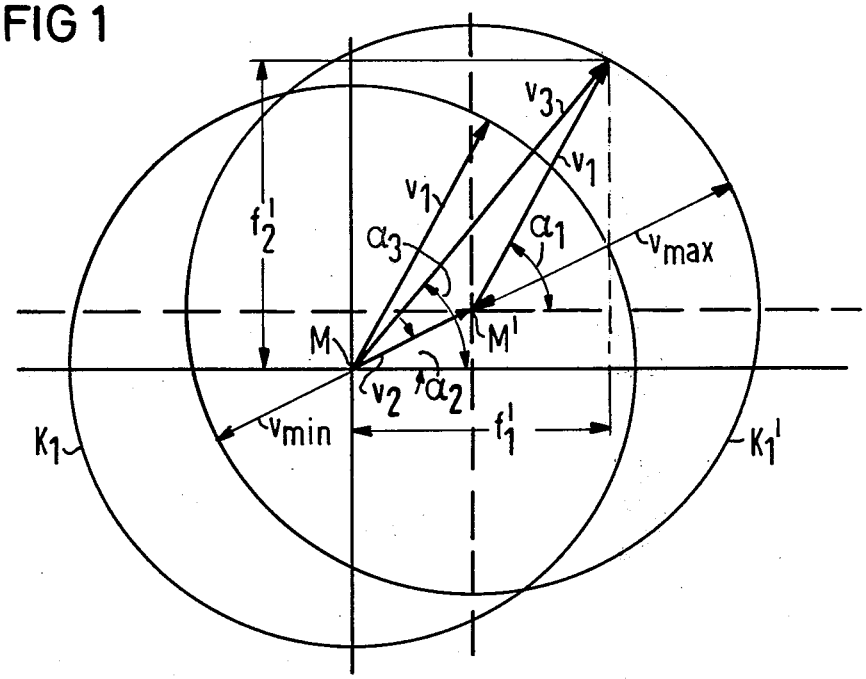
FIG. 1 is a schematic illustration of a magnetic field vector to be measured together with a noise vector in a polar coordinate system.

In a polar coordinate system, FIG. 1 schematically shows the magnetic field measurement with and without disruptive influence. The magnetic probe or the vehicle carrying the probe, is situated in the center M. A vector describing the external magnetic field is measured with the probe, said vector respectively indicating the amount and direction of the external field lines relative to a fixed center line of the probe or of the vehicle. Accordingly the vector $v_1$ describes the external magnetic field (earth's magnetic field). If no disruptive influences existed, then the amount of this vector would always be identical given circular travel. The point of the vector would move on the circle K1 around the center M.

When, however, an additional noise vector $v_2$ exists, then this noise vector is added to the magnetic field vector $v_1$, so that the magnetic field vector $v_1$ apparently turns around a center M'. Therefore, a vector $v_3$ is measured or calculated during the circular travel of the vehicle, said vector $v_3$ deriving from the vectoral addition of the fixed noise vector $v_2$ and the magnetic field vector $v_1$ which is variable in accordance with the vehicle movement. This calculated vector $v_3$ differs from the true field vector $v_1$ not only in terms of magnitude but also in terms of the angle $\alpha_3$ relative to the actual angle $\alpha_1$.

The measured vector $v_3$ reaches its maximum value $v_{max}$ when the angle of the earth's magnetic field $\alpha_1$ coincides with the angle of the noise vector $\alpha_2$ and, in contrast thereto, it reaches the minimum given a rotation of 180° when the magnetic field vector $v_1$ and the noise vector $v_2$ are superimposed in exactly opposite fashion. The noise vector can be determined by means of measuring these extreme values $v_{max}$ and $v_{min}$, namely in terms of the amount:

$$|v_2| = \frac{|v_{max}| - |v_{min}|}{2}$$

The angle of the noise vector corresponds to the angle of $v_{max}$, since $$\alpha_1 = \alpha_2 = \alpha_3$$

at this moment. Thus a correction vector must be directed exactly opposite the noise vector $v_2$ and correspond to it in terms of magnitude.

Figure 2:
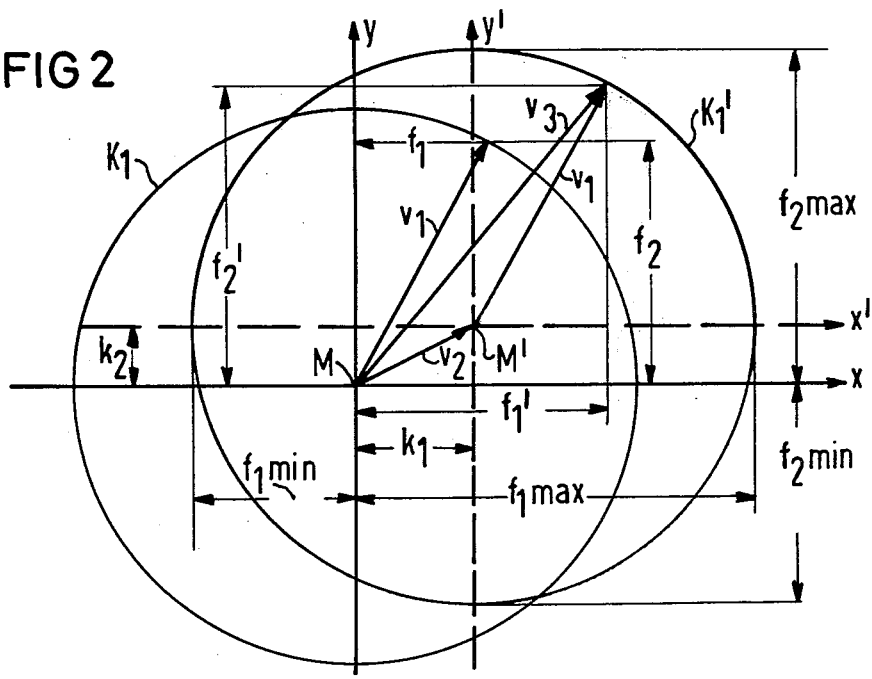
FIG. 2 illustrates the fundamental derivation of correction values in a Cartesian coordinate system.

When the mutually perpendicular components $f_1$ and $f_2$ of the magnetic field are measured in a Cartesian coordinate system according to FIG. 2, then one can separately determine a respective correction value for the two components. As already explained on the basis of FIG. 1, the true magnetic field vector $v_1$ would have to remain constant in magnitude given a circular movement of the probe, and would have to execute a circle K1 around the center M. As a result of the noise vector $v_2$, however, the center of the measured circle K1' is displaced from M toward M'. What is thus measured is an apparent magnetic field vector $v_3$ with its components $f'_1$ and $f'_2$. In order to determine the true magnetic field components $f_1$ and $f_2$, the correction values $k_1$ and $k_2$ which correspond to the x and y components of the noise vector $v_2$ must be subtracted from the measured values. In order to determine these correction values, the maximum and minimum values of the components on the x or, respectively, y axis are measured, namely $f_{1max}$ and $f_{1min}$ or $f_{2max}$ and $f_{2min}$. The correction values are derived therefrom according to the equations $$k_1 = \frac{|f_{1max}| - |f_{1min}|}{2}$$

and $$k_2 = \frac{|f_{2max}| - |f_{2min}|}{2}.$$

Thus, the influence of the noise vector $v_2$ can be eliminated by means of subtraction of said correction values $k_1$ and $k_2$ from the measured values $f'_1$ and $f'_2$. When there are no disruptive influences, then the amounts $f_{1max}$ and $f_{1min}$ or, respectively, $f_{2max}$ and $f_{2min}$ are respectively identical, so that the correction value becomes zero.

Figure 3:
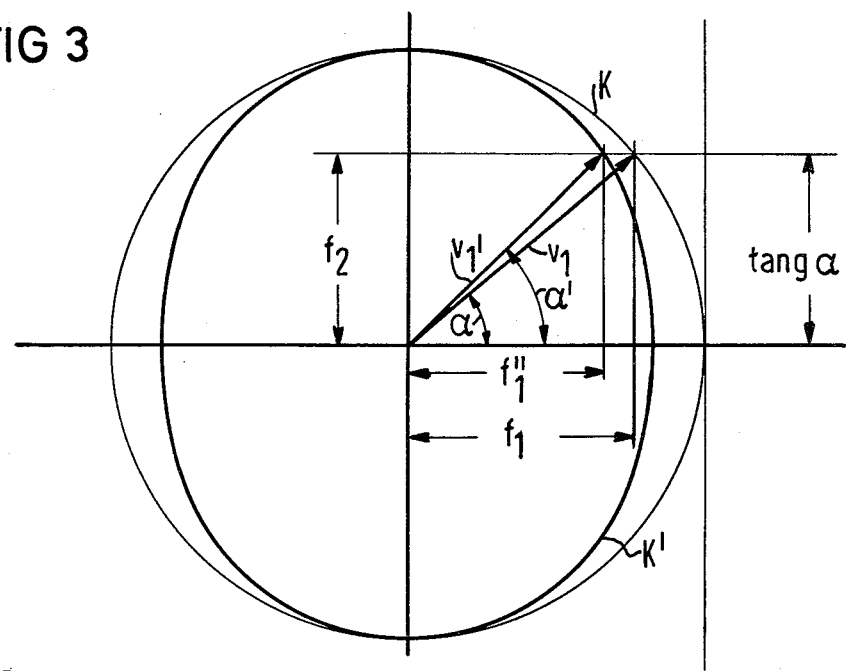
FIG. 3 is an illustration of a measured value distortion due to different coils for two magnetic field components in a polar coordinate system.

A further possibility of error in the field measurement may result since the two field components $f_1$ and $f_2$ are determined with different coils or with different evaluation circuits. By so doing, a distortion of the measured values can result as is shown on the basis of FIG. 3.

Given rotation of the probe, the field vector $v_1$ with the components $f_1$ and $f_2$ would have to lie on a circle K. The angle $\alpha$ can be calculated from the two components and thus the direction of the vector $v_1$ can be determined. However, if $f_1$ and $f_2$ are measured with coils or evaluation circuits which deviate from one another, then a scale displacement occurs as a result of which the circle K evolves into one another and a falsified angle $\alpha'$ results.

Figure 4:
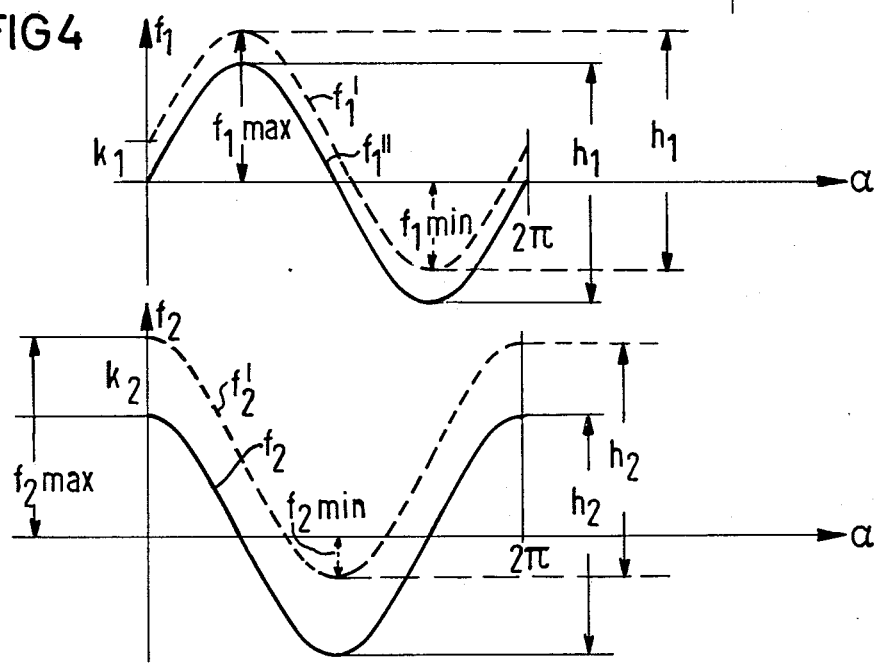
FIG. 4 illustrates the curve of the individual measured values for two magnetic field components given circular travel.

A correction of this distortion is based on the perception that given a constant external field, the amplitude values for both components must be of equal size, and that both $f_1$ as well as $f_2$ must execute the same amplitude swing. The gain of a correction factor for eliminating the measured value distortion is described on the basis of FIG. 4. There, the behavior of the individual measured values $f_1$ and $f_2$ as a function of the angle of rotation $\alpha$ of the probe is illustrated. The dot-dash value is respectively the measured value $f'_1$ or $f'_2$. These measured values are shifted relative to the zero line, namely as the result of a noise vector which is eliminated by the correction values $k_1$ and $K_2$. Accordingly the corrected measured values $f''_1$ and $f''_2$ result.

By means of this correction, the curve of the individual measured values is matched relative to the zero line, but the respective overall swing $h_1 = f_{1max} + f_{1min}$ and $h_2 = f_{2max} + f_{2min}$ is not changed. However, the overall swing of the measured values must be of the same size for both components. A correction factor m can be determined therefrom:

$$m = h_1/h_2$$

By means of multiplying the measured values $f_2$ by m, the distortion can thus be compensated.

A basic circuit for executing the described correction is now disclosed on the basis of FIGS. 5 through 7. There a magnetic probe MS with a following evaluation circuit AWS is presumed as being given. The probe exhibits, for example, two coils perpendicular relative to one another, whereby the two components of the external magnetic field are derived according to a known method, for instance according to German patent application Nos. P 29 49 815, P 30 29 532 or P 31 21 234, all incorporated herein by reference. These measured values $f'_1$ and $f'_2$ are present at the output of the evaluation circuit AWS. These outputs can be selectively connected to a calibration arrangement according to FIG. 5 or to a measuring circuit according to FIG. 6 with the changeover means US1. FOr calibration purposes, the switch US1 connects the output of the evaluation circuit AWS to two comparison devices VG1 and VG2 in which the maximum and minimum measured values for $f'_1$ and $f'_2$ are respectively determined and stored. A more detailed illustration of such a comparison device is shown in FIG. 7.

For calibrating the system, the probe or a vehicle with a built-in probe is driven in a full circle. The respective absolute values of $f_{1max}$, $f_{1min}$ as well as $f_{2max}$ and $f_{2min}$ are present in the comparison devices VG1 and VG2 after this calibration trip. With the changeover means US2, the outputs of the comparison devices VG1 and VG2 are then connected to the following adders ADD1 through ADD4 in which the stored measured values are linked. The respective difference of the magnitudes of $f_{1max}$ and $f_{1min}$ or $f_{2max}$ and $f_{2min}$ are formed in the two adders ADD2 and ADD4. In the following dividers DIV1 and DIV2, these determined differences are respectively divided by two and thus produce the additive correction values $k_1$ and $k_2$ which are input into a correction value memory SPK and which are kept ready for employment for the navigation.

The respective sum of the absolute values of $f_{1max}$ and $f_{1min}$ as well as of $f_{2max}$ and $f_{2min}$ are formed in the adders ADD1 and ADD3. The quotient from the two sums of the adder ADD1 and ADD3 are formed in the divider DIV3, the correction factor m deriving therefrom. Correction factor m is likewise deposited in the memory SPK. After calibration, both additive as well as multiplicative correction values are available in the correction value memory SPK for the actual navigation of the magnetic probe.

For navigation, the changeover means US1 is brought into the position according to FIG. 6. By so doing, the output of the evaluation circuit AWS is switched to the adder ADD5 so that the measured values $f'_1$ and $f'_2$ are continuously input into the adder during the travel of the vehicle. Moreover, the adder ADD5 receives the additive correction values $k_1$ and $k_2$ from the correction value memory SPK. The correction values are then added to the respective measured values $f'_1$ and $f'_2$, or are subtracted therefrom. Following the adder ADD5 is a multiplier MUL which also receives the correction factor m from the correction value memory SPK. At least one of the measured values—if need be corrected in the adder ADD5—is multiplied by the factor m in the multiplier MUL. If necessary, both measured values can be additionally multiplied with a further factor in order to achieve a specific measure for further computation.

Thus, the corrected measured values for the two magnetic field components are present at the output of the multiplier MUL. The direction of the magnetic field can now be determined therefrom in a simple manner since the one measured value is proportional to the sine $\alpha$ and the other measured value is proportional to the cosine $\alpha$. From these values, the tangent $\alpha$ can be calculated in the following trigonometric converter WU. Angle $\alpha$ can either be directly displayed at the display device AN1 or can be further processed in a following integrator INT. For example, the respectively traversed path s can be supplied from a path sensor WG to the integrator INT. In this instance, both the angle as well as the distance of the traversed path or, if need be, the distance to a desired destination can be displayed in a display device AN2. For example, the arrow R could identify the direction to the destination and the seven-segment display S could identify the straight line distance to the destination.

Based on the example VG1, FIG. 7 shows the gain of the maximum and minimum values in the calibration arrangement according to FIG. 5. Over the changeover means US1, each measured value of $f'_1$ is input into the two threshold switches SWS1 and SWS2. The first threshold switch SWS1 switches through at every value which is greater than the preceding value of $f'_1$ whereas the threshold switch SWS2 switches through given every value which is smaller than the preceding value of $f'_1$. After a connection through of the threshold switch SWS1 or SWS2, each new value is input into a threshold memory SPS1 and SPS2 over an intermediate memory ZSP1 or ZSP2. The content of the threshold memory SPS1 or SPS2 forms the respective new threshold for the corresponding threshold switch SWS1 or SWS2. After a complete circular trip of the vehicle with the probe MS, the maximum value f'₁ is present in the intermediate memory ZSP1 and the minimum value f'₁ is present in the intermediate memory ZSP2. The respective amount of $f_{1max}$ or $f_{1min}$ is formed therefrom in the absolute value formation stages ABS1 and ABS2 and is stored in the following maximum value memory SPM1 or the minimum value memory SPM2. Proceeding from there, these absolute magnitudes can be further processed according to FIG. 5.

Although various minor modifications may be suggested by those varied in the art, it should be understood that we wish to embody within the scope of the patent warranted hereon, all such embodiments as reasonably and properly come within the scope of our contribution to the art.

We claim as our invention:

1. A correction system for a magnetic field probe which measures an external magnetic field in terms of magnitude and direction, and wherein the probe is moved in a circle before a beginning of the measurement, comprising:

means for determining maximum and minimum values of a magnetic field vector relative to the probe by continuous measurement of said magnetic field vector during the circular movement;

means for forming a correction vector from a halved vector sum of said maximum and minimum values;

means for vectorally adding the correction vector to the respective measured values of the probe during the continuous measurement;

the magnetic field probe being followed by an evaluation circuit whose output is selectively connected over a changeover means to a calibration means or to a measuring unit having a display device connected thereto;

and a correction value memory being provided whose input is connected to the calibration means and its output is connected to the measuring unit.

2. A system according to claim 1 wherein the calibration means has comparison means for determining the maximum and minimum values, adders following the comparison means, dividers following said adders, and outputs of said dividers being supplied to the correction value memory.

3. A system according to claim 2 wherein each comparison means has threshold switch means both for positive as well as for negative values back-coupled over intermediate memories, and said threshold switch means are respectively followed by an absolute value formation stage as well as by a respective memory means for the respective maximum or minimum value.

4. A system according to claim 1 wherein in adder means is provided in the measuring installation for addition or additive correction values supplied from the correction value memory to the respective measured values.

5. A system according to claim 1 wherein a multiplier means is provided in the measuring unit for multiplying measured values of a magnetic field component by a correction factor supplied from the correction value memory.

6. A system according to claim 4 wherein the adder means is followed by a divider, a trigonometric converter, and a display means.

7. A system according to claim 4 wherein the multiplier means is followed by a divider, a trigonometric converter, and a display means.

8. A system according to claim 6 wherein an output of the trogonometric converter is supplied in common with an output of a path sensor to a display means over an integrator.

* * * * *